United States Patent [19]

Kautz

[11] 4,434,423
[45] Feb. 28, 1984

[54] DOPPLER VOR
[75] Inventor: Werner Kautz, Korntal, Fed. Rep. of Germany
[73] Assignee: International Standard Elektric Corporation, New York, N.Y.
[21] Appl. No.: 355,514
[22] Filed: Mar. 8, 1982
[30] Foreign Application Priority Data
Mar. 10, 1981 [DE] Fed. Rep. of Germany ....... 3108980
[51] Int. Cl.$^3$ ............................................. G01S 1/44
[52] U.S. Cl. .................................................... 343/406
[58] Field of Search ....... 343/106 D, 106 R, 113 DE; 364/451

[56] References Cited
U.S. PATENT DOCUMENTS
4,005,427 1/1977 Höfgen ........................... 343/106 D Primary Examiner—Theodore M. Blum
Attorney, Agent, or Firm—T. E. Kristofferson; W. T. O'Neil

[57] ABSTRACT

In a Doppler VOR, the phase of the carrier wave of the carrier signal must lie symmetrically between the phases of the carrier waves of the sideband signals. To monitor these phase relationships, the carrier signal received by the sideband antennas (1) is applied to two mixers (14, 15) which are also fed with fractional signals of the upper and lower sidebands, respectively. The mixer output signals are applied to a phase comparator (16) whose output signal has a predetermined value corresponding to the prescribed phase relationships. The output signal of the phase comparator (16) is compared with a reference value in a monitoring facility (19).

9 Claims, 2 Drawing Figures

DOPPLER VOR

BACKGROUND OF THE INVENTION

1. Field of the Invention

The present invention relates to Doppler VOR systems generally, and more particularly to a VOR system in which upper and lower sideband signals are relative phase monitored.

2. Description of the Prior Art

A Doppler VOR system of the type to which the invention applies to disclosed in German Patent No. 2505723. That patent specification shows what measures have to be taken to permit correct monitoring of the radiated signal even in the near field.

Basically, a Doppler VOR transmits carrier and sideband signals. The frequencies of the sideband signals differ from the frequency of the carrier signal by $\pm 9960$ $H_z$. Correct transmission requires that the phase of the carrier signal be symmetrical with respect to the phases of the sideband signals.

In the prior art, various approaches have been employed for ensuring the sideband-to-carrier phase relationship but these have usually depended on separate monitoring antennas and other complications.

SUMMARY OF THE PRESENT INVENTION

With the novel Doppler VOR, according to the invention, it is possible to check in the near field whether the phase relationship between the carrier waves of carrier and sideband signals is correct. To monitor this phase relationship, no additional monitor antennas are necessary.

A particularly advantageous amplitude modulator is described and is an important element in the system of the invention. This modulator can also be used in installations other than the Doppler VOR. During the modulation, no phase distortion of the RF signal occurs in this amplitude modulator, and its characteristic impedance is reciprocal and remains substantially constant during modulation, both in the direction from the signal source to the load and in the direction from the load to the signal source.

DETAILED DESCRIPTION

In this description, those parts of the Doppler VOR (hereinafter abbreviated to "DVOR") and those signals and signal modulations which are of no importance to the invention will be omitted for the sake of simplicity and clarity.

Figure 1:
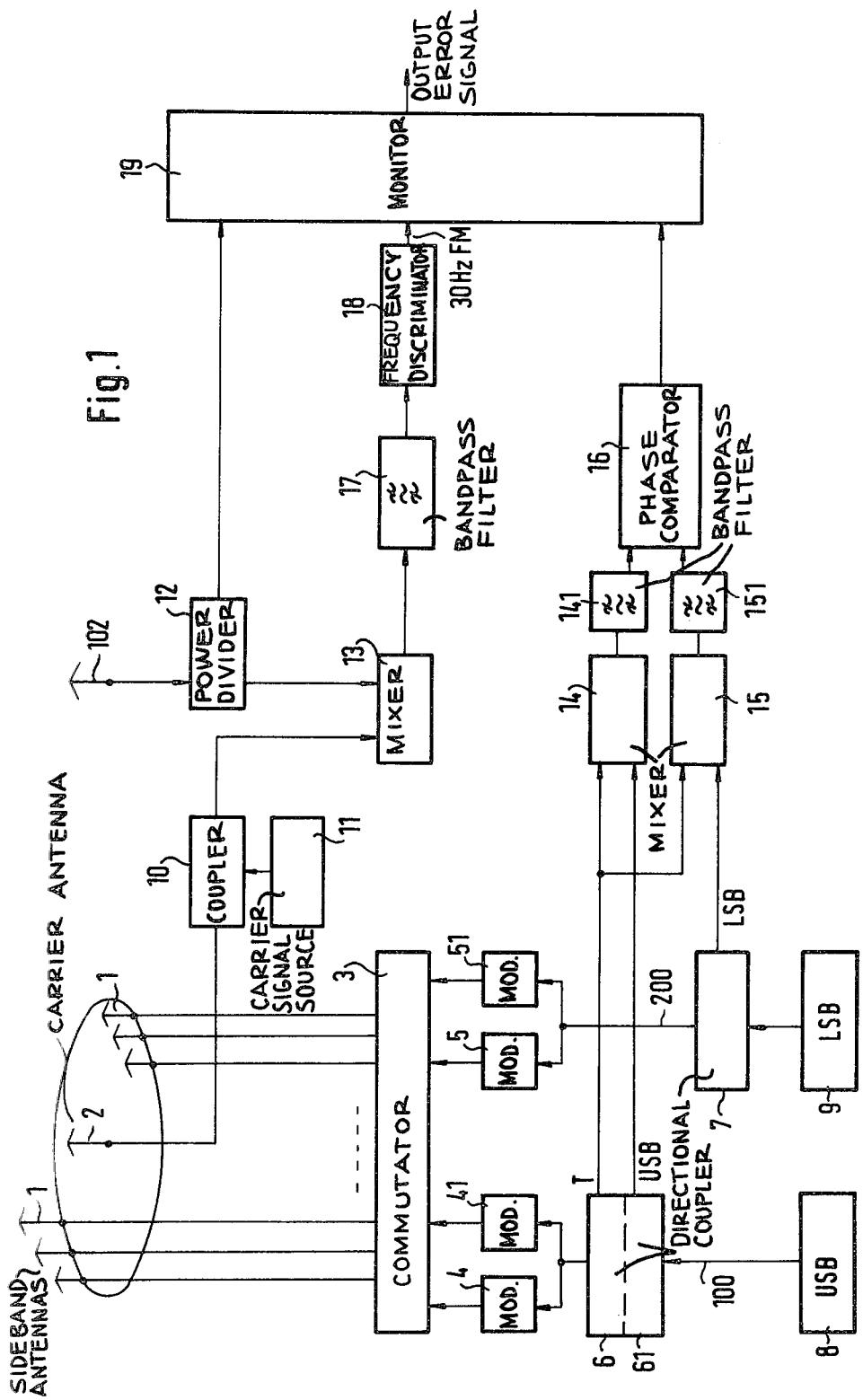
FIG. 1 is a block diagram illustrating the overall system of a Doppler VOR according to the invention.

Referring now to FIG. 1, a carrier-signal source 11 will be seen to provide a carrier signal which is radiated from a carrier antenna 2. Similarly, upper and lower sideband signals are generated in sideband-signal sources USB and LSB, respectively, and are radiated from sideband antennas 1. The sideband antennas are arranged about the perimeter of a circle, as shown, and the carrier antenna is at the center of this circle.

In a double-sideband DVOR, the sideband signals (upper sideband: USB; lower sideband: LSB) are applied to the sideband antennas in a manner to simulate movement of two radiation sources located opposite each other on the circle. One of these radiation sources radiates the upper sideband, and the other radiates the lower sideband.

To insure that as continuous a radiation-source movement as possible is simulated, there is no "hard changeover" from one antenna to the adjacent one; by "hard changeover" is meant activation sequentially and abruptly.

"Soft changeover" is achieved by applying the sideband signals to two adjacent antennas and suitably amplitude-modulating them. For the amplitude modulation of each of these two sideband signals, two amplitude modulators 4, 41 and 5, 51 are provided.

The sideband signals are switched from one antenna to another by means of a commutator 3.

The components described so far, their operation and their control are generally known and are therefore explained only briefly.

In navigation transmitters it is particularly important that the radiated signals maintain their prescribed values. Therefore, monitoring facilities are provided for continuously monitoring these values.

In the navigation signal transmitted by a DVOR, the phase of the carrier wave of the carrier signal radiated from the carrier antenna 2 must lie symmetrically between the phases of the carrier waves of the sideband signals radiated from sideband antennas located opposite each other on the circle. To monitor the following apparatus is provided and arranged as will be described.

Directional coupler 61 and 7 couple out a fraction of the sideband signals produced by the USB and LSB sideband-signal sources, respectively, and apply these fractional signals to mixers 14 and 15, respectively. The sideband antennas 1 not only radiate the sideband signals but also receive the carrier signal radiated by the carrier antenna 2. This carrier signal travels the circuit path followed by the sideband signals between the signal sources and the antennas but in the opposite direction. If the carrier component of a sideband signal is shifted in phase in the path between the sideband signal from the signal source and the antenna, the phase of the signal received and passed on by the sideband antenna will be shifted by the same amount.

A directional coupler 6 couples the carrier signal intercepted by a sideband antenna 1 and extant in the feeder 100 for the upper sideband signal, and applies it to the two mixers 14 and 15, in which the upper and lower sideband signals, respectively, are thus mixed with the carrier. It would also be possible to provide an additional directional coupler comparable to 6 in the feeder 200 for the lower sideband signals. In that case, the output signals of the directional couplers coupling out the carrier signal would be applied to one mixer each. The directional couplers for coupling out the carrier signal and the sideband signal from the feeder 100 and 200 may also be bi-directional couplers (a bi-directional coupler couples out the carrier signal and the sideband signal).

The output signals of the mixers are signals whose frequency is equal to the difference between the frequencies of the carrier signal and the sideband signal, i.e., in the case of a DVOR, this frequency is 9960 Hz. The phase difference between the carrier signal and a sideband signal is imaged onto the output signal of a mixer (as follows from a vector diagram). The imaged phase difference is the phase difference in the radiation field, because the carrier signal used for mixing is the signal radiated by the carrier antenna, and not a signal extracted directly from the carrier transmitter, and because the carrier signal intercepted by the sideband antennas travels between the antenna and coupler by the same path as the sideband signal.

The output signals of the mixers 14, 15 are passed through filters 141, 151 and applied to a phase comparator 16. If the carrier components have the prescribed phase relationship to each other, the phase difference measured in the phase comparator 16 will be zero. The output signal of phase comparator 16 is applied to a monitoring facility 19, which compares the result measured by the phase comparator with the desired value corresponding to a zero phase difference. If the difference between the measured value and the desired value exceeds the permissible limits, an alarm will be produced in an indicating unit.

When the installation is put into operation, the output indication from monitor 19 can be used to set the prescribed phase relationships. It is also possible to expand the Doppler VOR so that the measured phase difference is used to derive a regulating signal for automatically controlling these phase relationships.

To monitor the signals radiated from the DVOR, it is necessary, among other things, to recover the 30-Hz modulating signal with which the sideband signals are frequency-modulated.

To do this, a dipole 102 is set up, in known manner, at a predetermined distance from the sideband antennas 1 to receive the total signal package radiated by the DVOR.

One of the outputs of a power divider 12 fractivates the signal received by the dipole 102 and that part of the carrier signal at one output of 12 is applied to a mixer 13. The mixer 13 also responds to a fractional signal from coupler 10. The mixer 13 output is applied to a bandpass filter 17 whose passband is centered at 9960 Hz. The signal passed by the filter is applied to a frequency discriminator 18, which delivers the desired 30-Hz signal originally used to frequency-modulate the DVOR sideband signals.

The other output signal of the power divider 12, the output signal of the discriminator 18, and the output signal of the phase comparator 16 are applied to the monitoring facility 19, in which the parameters to be monitored may be conventionally evaluated as required.

In the description of FIG. 1, amplitude modulators 4, 41, 5, 51 are mentioned. This novel element of the combination will now be explained with the aid of FIG. 2. It not only is particularly suitable for use in a Doppler DVOR but also represents per se an advantageous new amplitude modulator circuit.

From Meinke/Gundlach, "Taschenbuch der Hochfrequenztechnik", (Springer-Verlag, Berlin, 1968, page 1309), it is known that absorption modulators can be used as amplitude modulators. It is a special advantage of the novel amplitude modulator of FIG. 2 that, depending on the application, the controllable resistances are chosen so that the phase of the signal to be modulated is 0° or 180° after modulation, but is otherwise unaltered. Thus, no RF phase control is necessary, and the loading at the input and output of the amplitude modulator is not changed during the modulation process.

Figure 2:
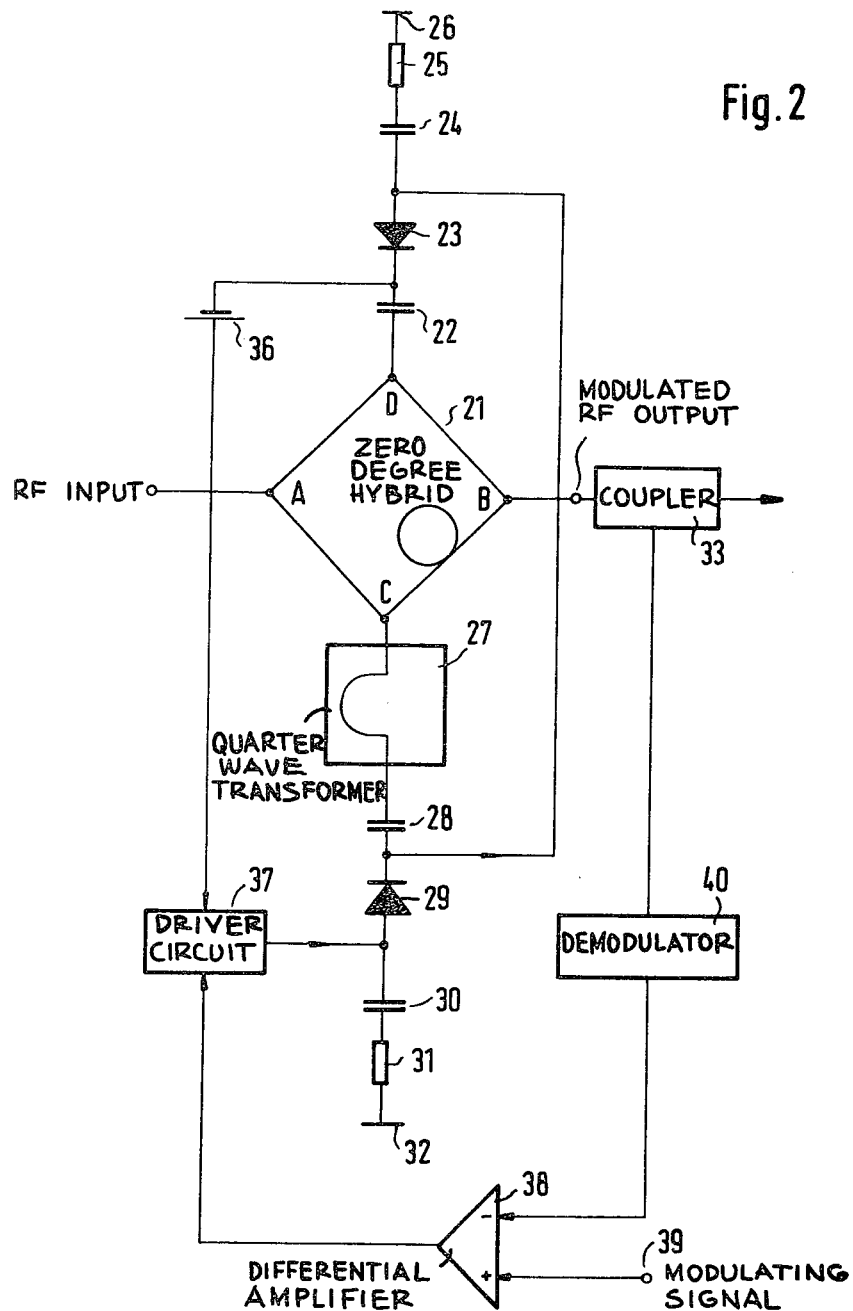
FIG. 2 is a schematic diagram of an amplitude modulator as used in the Doppler VOR of FIG. 1.

The amplitude modulator of FIG. 2 includes a 0° hybrid (ring) 21 with four terminals A, B, C, and D. Between the terminals C and B, a phase shift of 180° takes place. 0° hybrids are described in Meinke/Gundlach, "Taschenbuch der Hochfrequenztechnik", 1968, pp. 382 et seq., in connection with such ring circuits. These circuits are useful to distribute the RF signal applied to the 0° hybrid through an input A to two outputs C and D. If the outputs C and D "look into" equal resistive loads, the signals taken from these outputs are attenuated with respect to the input signal by 3 dB, and the terminal B is effectively isolated from the input A.

As this 0° hybrid 21 is employed in the amplitude modulator of the invention, the RF input signal to be modulated is applied to the terminal A (input), and an amplitude-modulated RF output signal is obtained from the terminal B (output).

The terminals D and C (modulating-signal inputs) are loaded with equal resistive termination networks. Each resistive termination consists of a PIN diode (23,29) and a resistor (25,31) as shown, the resistors (25,31) being of fixed value. These resistors serve to set a lower limit to the terminating resistance to prevent the latter from ever reaching zero. Accordingly, no phase reversal can occur at the output of the amplitude modulator, but if phase reversal is desired, the fixed resistors will be omitted.

The termination network for the terminal C is connected to an RF transformer circuit 27 which transforming circuit 27 has a length of one quarter-wavelength of the RF carrier wave and operates to transform the value R of the termination to a value of 1/R at the terminal C.

Isolating capacitors 22 and 24 are connected between the PIN diode 23 and the terminal D, and between the PIN diode 23 and the resistor 25, respectively. Also, isolating capacitors 28 and 30 are connected, respectively, between the PIN diode 29 and the transforming circuit 27 and between the PIN diode 29 and the resistor 31, whose other terminal is connected to ground 32 as is the case for resistor 25. The RF resistances of the isolating capacitors are negligible.

To obtain the desired amplitude modulation, it is necessary that a linear relationship exist between the modulating signal and the variation in the aforementioned effective terminating resistances. As the characteristics of the PIN diodes are inherently nonlinear, it is necessary to provide an equalizing network which compensates for the nonlinearity of that characteristic. The design of such an equalizing network is familiar to those skilled in the art and, therefore, will not be explained here. In the embodiment, the equalizing network is incorporated in the driver circuit 37.

To facilitate change of terminating resistances in the same manner, the same control current is advantageously caused to flow through both PIN diodes 23 and 29. The modulating signal applied to the modulator through the terminal 39 is passed on to the driver circuit 37, the latter being energized from the positive terminal of a power supply 36. Driver 39 thus controls the current flowing through PIN diode 29 and, accordingly, the resistance of this PIN diode. The current having passed through the PIN diode 29 is coupled out, as shown, and passed through PIN diode 23 of the other termination circuit. The junction of the PIN diode 23 and the isolating capacitor 22 is connected to the negative terminal of the power supply 36. Thus, the resistance R provided by the PIN diodes 23, 29 and the resistors 25, 31 are each changed by the same value. As a result of the transformation of this resistance R to the value 1/R at the terminal C, the two terminals C and D are instantaneously no longer loaded equally, so that a current directly proportional to the modulating signal flows to the terminal B, i.e., the RF input signal is amplitude-modulated with the modulating signal because of the control of the resistances R. The desired amplitude-modulated RF signal is taken from the output B.

If Z is the characteristic impedance of the amplitude modulator, L is the length of the line sections of the 0° hybrid, $Z_L$ is the characteristic impedance of a line section, R is the resistance provided by a PIN diode (23 or 29) and resistor (25 or 31), and $Z'_L$ is the characteristic impedance of the transforming circuit 27, the relationships will advantageously be chosen as follows:

$$Z_L = Z$$

$$L = \lambda/4$$

$$R = r(Z/2)$$

$$Z'_L = Z_L/2,$$

where $\lambda$ is the wavelength corresponding to the center frequency of the RF signal, and r is a resistance with the limit values 0 and $\infty$.

To compensate for any errors caused during the modulation which distort the envelope waveform of the modulated signal, an additional control circuit is provided. To this end, a coupler 33 extracts a fraction of the modulated RF signal at the RF output (B). This extracted fractional signal is demodulated in a demodulator 40 and then applied to a differential amplifier 38, whose other input is fed the modulating signal. The output signal of the differential amplifier is then applied to the driver circuit 37 instead of the modulating signal, in lieu of direct feed of the modulating signal to the driver circuit. An inverse feedback loop is thereby achieved.

What is claimed is:

1. A Doppler VOR system comprising a circular array of sideband antennas and a carrier antenna located at the center of said circle, wherein the upper sideband signal and the lower sideband signal are applied from separate sideband-signal sources to said sideband antennas seriatim through a commutator, and wherein a monitoring facility is provided for monitoring the radiated signals, comprising a first directional coupler (61) connected to couple out a small part of said upper sideband signal (USB) and passes it to a first mixer (14); a second directional coupler (7) connected to couple out a small part of said lower sideband signal (LSB) and pass it to a second mixer (15); at least one additional directional coupler (6) for coupling the carrier signal (T) intercepted by a sideband antenna (1) out of a feeder (100) for one of said sideband signals, said carrier signal being applied to said first and second mixers; a phase comparator (16) responsive to the outputs of said mixers to determine the phase difference between said mixer outputs, and comparison means for evaluating the phase relationships among said sidebands and said carrier for developing an error signal indicative of deviation of the symmetrical phase relationship between said carrier and sidebands.

2. A Doppler VOR as claimed in claim 1, in which said directional couplers are coupled out (61, 7) before being applied to said commutator (3).

3. A Doppler VOR as claimed in claims 1 or 2, comprising means to couple out the carrier signals, one directional coupler in each of two sideband feeders are supplied, and that the output signal of one of the directional couplers is applied to said first mixer, while the output signal of the other directional coupler is applied to said second mixer.

4. A Doppler VOR as claimed in claim 1, in which amplitude modulators (4, 41, 51, 51) are provided connected between said sideband-signal sources (8, 9) and said commutator (3).

5. A Doppler VOR as claimed in claim 4, in which said amplitude modulators are absorption modulators, each of said absorption modulators containing a 0° hybrid (21) with four terminals (A, B, C, D), that the terminals (C, D) adjacent to the input terminal (A) are each terminated in equal, controllable resistances (29, 31; 23, 25), that the values of both resistances are controlled by the modulating signal in the same manner, that between one of the adjacent terminals (C) and the associated termination (29, 31), a transforming device (27) is inserted which transforms the termination resistance to the terminal (C) of the 0° hybrid (21) in such a way that this terminal is loaded with the reciprocal of this resistance, and that the modulated output signal is taken from said terminal (B) opposite said input terminal (A).

6. A Doppler VOR as claimed in claim 5, in which each of said terminations includes a PIN diode (23, 29) and a fixed resistor (25, 31), and means are included for varying a current flowing through said diodes to vary the effective resistance of said terminations.

7. A Doppler VOR as claimed in claim 6, in which isolating capacitors (22, 28) are inserted between the terminals (D, C) of the 0° hybrid and the terminations (23, 25; 29, 31).

8. A Doppler VOR as set forth in claim 7, in which the modulating signal is applied to a driver circuit (37), the output signal of said driver circuit supplying said current through said PIN diode (29) of one of said terminations, and that the output signal of this PIN diode (29) controls the current flowing through said PIN diode (23) of said other termination.

9. The Doppler VOR according to claim 8, further including a demodulator responsive to the modulated output of said B terminal and a differential amplifier one input of which is responsive to said demodulator, the other input responding to said modulating signals, a feedback arrangement being thereby provided for enhancing the linearity of the modulation process.

* * * * *